United States Patent
Miki et al.

(10) Patent No.: US 11,881,516 B2
(45) Date of Patent: Jan. 23, 2024

(54) SEMICONDUCTOR ELEMENT COMPRISING A MIM CAPACITOR AND A VIA HOLE, A BOTTOM OF THE VIA HOLE BEING PLACED BETWEEN A REAR SURFACE OF A SOURCE ELECTRODE AND A REAR SURFACE OF A BARRIER METAL LAYER

(71) Applicant: Mitsubishi Electric Corporation, Tokyo (JP)

(72) Inventors: Kohei Miki, Tokyo (JP); Shinichi Miyakuni, Tokyo (JP); Kohei Nishiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 337 days.

(21) Appl. No.: 17/287,709

(22) PCT Filed: Dec. 27, 2018

(86) PCT No.: PCT/JP2018/048157
§ 371 (c)(1),
(2) Date: Apr. 22, 2021

(87) PCT Pub. No.: WO2020/136808
PCT Pub. Date: Jul. 2, 2020

(65) Prior Publication Data
US 2021/0384312 A1    Dec. 9, 2021

(51) Int. Cl.
*H01L 29/45* (2006.01)
*H01L 23/48* (2006.01)
(Continued)

(52) U.S. Cl.
CPC .......... *H01L 29/454* (2013.01); *H01L 23/481* (2013.01); *H01L 28/60* (2013.01)

(58) Field of Classification Search
CPC ..... H01L 29/454; H01L 23/481; H01L 28/60; H01L 21/8252; H01L 27/0733; H01L 21/76898; H01L 21/7687; H01L 28/40
See application file for complete search history.

(56) References Cited

U.S. PATENT DOCUMENTS

2006/0113676 A1    6/2006    Ichinose et al.
2016/0056273 A1    2/2016    Senda
(Continued)

FOREIGN PATENT DOCUMENTS

JP    H04-252038 A    9/1992
JP    2006-156716 A    6/2006
(Continued)

OTHER PUBLICATIONS

An Office Action; "Notice of Reasons for Refusal", mailed by the Japanese Patent Office dated Feb. 8, 2022, which corresponds to Japanese Patent Application No. 2020-562050 and is reltaed to U.S. Appl. No. 17/287,709; with English language translation.
(Continued)

*Primary Examiner* — Herve-Louis Y Assouman
(74) *Attorney, Agent, or Firm* — Studebaker & Brackett PC

(57) ABSTRACT

Provided herein is: a SiC substrate having a front surface on which a GaN layer is stacked; a source electrode formed on a front surface of the GaN layer; a MIM capacitor formed on a front surface of the source electrode; and a via hole extending from a rear surface of the SiC substrate to reach the source electrode; wherein a barrier metal layer is included in the source electrode, and wherein the depth end of the via hole is placed between a rear surface of the source electrode and a rear surface of the barrier metal layer. Accordingly, intrusion of a halogen element, in particular,
(Continued)

Br, into an insulating film that is placed in the MIM capacitor, is suppressed over a long term.

20 Claims, 8 Drawing Sheets

(51) Int. Cl.
*H01L 21/8252* (2006.01)
*H01L 27/07* (2006.01)
*H01L 21/768* (2006.01)
*H01L 49/02* (2006.01)

(56) References Cited

U.S. PATENT DOCUMENTS

2016/0343809 A1* 11/2016 Green ..................... H01L 23/66
2020/0098634 A1    3/2020 Tsunami

FOREIGN PATENT DOCUMENTS

JP    2016-046306 A    4/2016
WO    2018-173275 A1   9/2018

OTHER PUBLICATIONS

International Search Report issued in PCT/JP2018/048157; dated Mar. 19, 2019.
An Office Action mailed by the Korean Intellectual Property Office dated Apr. 27, 2023, which corresponds to Korean Patent Application No. 10-2021-7017619 and is related to U.S. Appl. No. 17/287,709; with English language translation.

* cited by examiner

SEMICONDUCTOR ELEMENT COMPRISING A MIM CAPACITOR AND A VIA HOLE, A BOTTOM OF THE VIA HOLE BEING PLACED BETWEEN A REAR SURFACE OF A SOURCE ELECTRODE AND A REAR SURFACE OF A BARRIER METAL LAYER

TECHNICAL FIELD

The present application relates to a semiconductor element structure.

BACKGROUND ART

Heretofore, in semiconductor elements, there is a problem that, with the provision of wire-based interconnection, characteristics of the semiconductor, in particular, the frequency characteristic thereof, may be degraded by a capacitance added due to the interconnection. Thus, at present, in order to reduce the capacitance due to the wire-based interconnection, it is general to provide a via hole for establishing conduction from a source electrode or the back side of a pad that is drawn from the source electrode. This structure has to be formed in wafer processes, unlike that a wire for establishing conduction is struck in an assembly process after completion of the wafer processes. Thus, when conduction is established using an AuSn solder, corrosion of the electrode or disconnection may occur because of the dispersion of Au into the AuSn solder that has intruded into the via hole under the source electrode or the pad drawn from the source electrode.

As a measure for dealing with such a problem, in Patent Document 1, for example, there is disclosed a method for preventing occurrence of corrosion or the like, by providing a barrier metal between the AuSn solder and Au as the source electrode, to thereby prevent Au in the upper layer side from dispersing into the AuSn solder.

CITATION LIST

Patent Document

Patent Document 1: Japanese Patent Application Laid-open No. 2016-46306 (Paragraph 0021; FIG. 4)

SUMMARY OF THE INVENTION

Problems to be Solved by the Invention

According to the above method, however, attention is paid only to corrosion and disconnection caused by the dispersion of Au and an effect as a stopper consideration is given with respect to suppressing deterioration of an insulating film in a MIM (Metal-Insulator-Metal) structure, said MIM structure being frequently used, for example, on an MMIC (Monolithic Microwave Integrated Circuit) in which elements are integrated on a semiconductor body, and said deterioration being caused by intrusion of a gaseous halogen up to a MIM capacitor in the MIM structure in the case where a via hole is formed under that MIM capacitor. In the case where the via hole is formed beneath the MIM capacitor, there is a problem that it is difficult: to prevent the capacitance and the leakage current that is influential on the reliability, from being changed because of the dispersion of a gaseous halogen (in particular, Br included in a frame-retardant board, or the like) through Au into the insulating film of the MIM capacitor; and to prevent corrosion of Ti, Nb, Mo or the like included in the metal member from occurring due to the thus-dispersed Br.

This application discloses a technique for solving such a problem described above, and an object thereof is to provide a semiconductor element structure which can prevent corrosion from occurring due to a gaseous halogen, to thereby ensure long-term reliability thereof.

Means for Solving the Problems

A semiconductor element structure disclosed in this application is characterized by comprising: a SiC substrate having a front surface on which a GaN layer is stacked; a source electrode formed on a front surface of the GaN layer; a MIM capacitor formed on a front surface of the source electrode; and a via hole extending from a rear surface of the SiC substrate to reach the source electrode; wherein a barrier metal layer is included in the source electrode; and wherein a bottom of the via hole is placed between a rear surface of the source electrode and a rear surface of the barrier metal layer.

Effect of the Invention

According to the invention, such a configuration is employed in which the barrier metal layer having resistance to a halogen element is inserted in the source electrode, so that it is possible to suppress intrusion of a halogen element, in particular, Br, into an insulating film that is placed in the MIM capacitor, over a long term.

MODES FOR CARRYING OUT THE INVENTION

Embodiment 1

Figure 1:
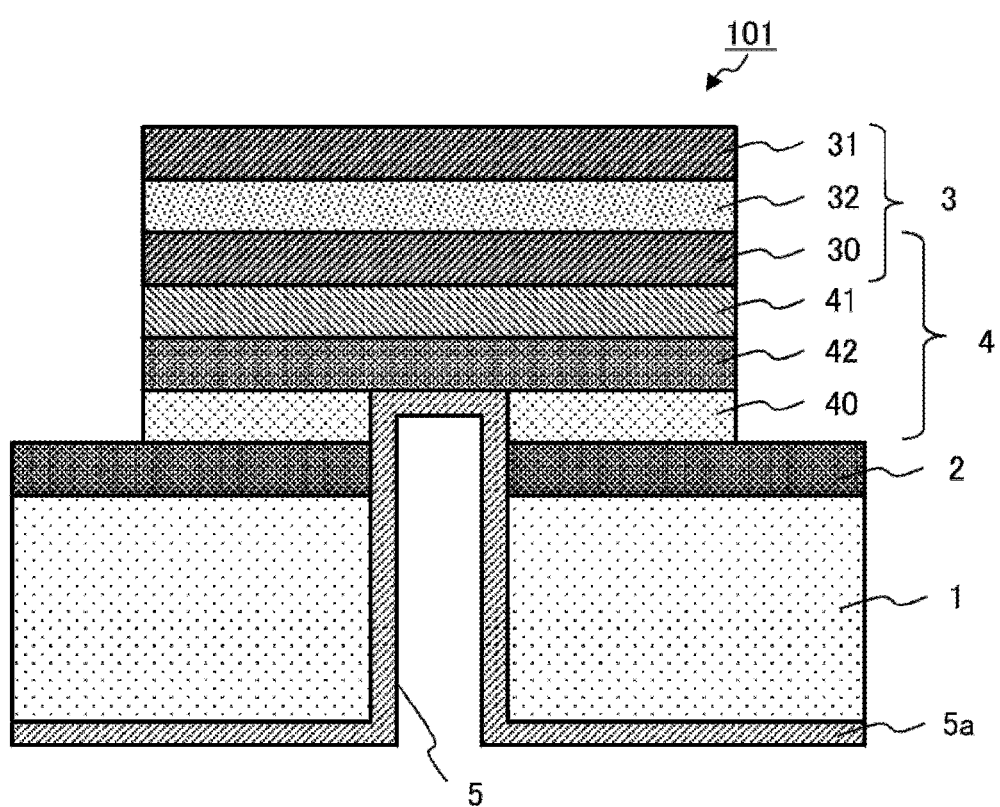
FIG. 1 is a sectional view showing a configuration of a semiconductor element structure according to Embodiment 1.

FIG. 1 is a sectional view showing a configuration of a semiconductor element structure according to Embodiment 1. As shown in FIG. 1, a semiconductor element structure 101 is configured with a SiC substrate 1, a GaN layer 2 formed on the front surface of the SiC substrate 1, a MIM capacitor 3 formed on the front surface of the GaN layer 2, a source electrode 4 which includes a metal layer 30 that also constitutes the lower side of a MIM structure as the MIM capacitor 3, and a via hole 5 extending from the rear surface of the SiC substrate 1 to reach the source electrode 4.

The MIM capacitor 3 is a thin-film capacitor having the MIM (Metal-Insulator-Metal) structure in which an insulating film 32 is sandwiched between the metal layer 30, a lower layer, as a first metal layer and a metal layer 31, an upper layer, as a second layer; and the insulating film is an intermediate insulating film for creating a capacitance. The insulating film 32 is not particularly limited so far as it is a film whose purpose is to ensure dielectric strength and which is categorized into an insulating film, such as of SiN, $SiO_2$, SiON or the like.

The source electrode 4 is comprised of: a Ti layer 40 for establishing bonding and ohmic contact between the GaN layer 2 and the MIM capacitor 3; a barrier layer 42 for preventing intrusion of a halogen; an Au layer 41 for preventing oxidization of the barrier metal layer 42; and the metal layer 30 as the lower layer of the MIM capacitor 3.

As the material of the barrier metal layer 42, Cr or V is employed which has resistance to intrusion of Br that is, among halogen elements, an element which will particularly cause deterioration of the insulating film 32 placed in the MIM capacitor 3. Because the material itself has high stress, the thickness of the barrier metal layer 42 is set to 500 nm or less for Cr, and to 300 nm or less for V, in order not to give strain due to that stress, to the insulating film 32 in the MIM capacitor 3. Note that, in either case of Cr or V, such a thickness that corresponds to 10 atomic layer is acceptable as a lower limit; however, in view of controllability of the vapor deposition apparatus, the sputtering apparatus and the like, during deposition, it is desired that the thickness be set to nm or more in order to maintain the long-term reliability as a barrier.

In this manner, by employing a configuration in which the barrier metal layer 42 having resistance to a halogen element is inserted in the source electrode 4 which includes the metal layer 30 that is also the lower layer of the MIM capacitor 3, intrusion of a halogen element, in particular, Br, into the insulating film 32 placed in the MIM capacitor 3 is suppressed over a long term.

Next, description will be made about a method of manufacturing the semiconductor element structure 101 according to Embodiment 1, on the basis of FIG. 2 to FIG. 8. FIG. 2 to FIG. 8 are sectional views showing respective manufacturing steps of the semiconductor element structure 101 according to Embodiment 1.

Figure 2:
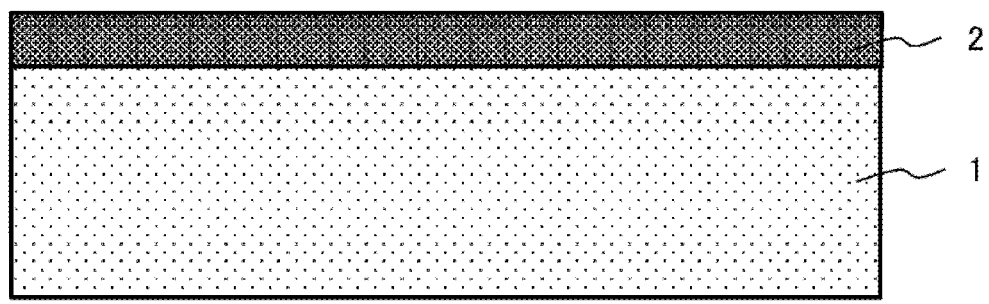
FIG. 2 is a sectional view for illustrating a method of manufacturing the semiconductor element structure according to Embodiment 1.
Figure 3:
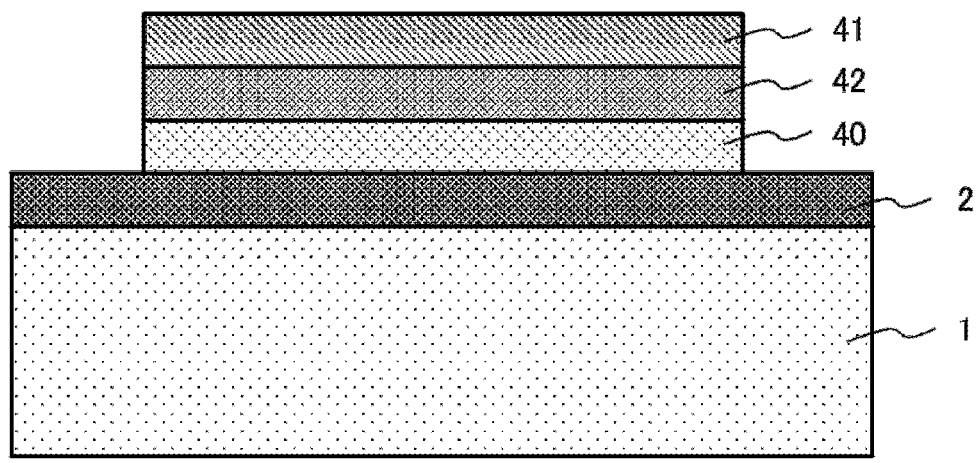
FIG. 3 is a sectional view for illustrating the method of manufacturing the semiconductor element structure according to Embodiment 1.

First, using the SiC substrate 1 shown in FIG. 2 on which the GaN layer 2 is stacked by epitaxial growth, as shown in FIG. 3, the Ti layer 40, the barrier metal layer 42 and the Au layer 41, as layers for the source electrode, are sequentially stacked on the front surface of the GaN layer 2. With respect to the metal deposition method in this step, it does not manner whether it is sputtering or vapor deposition, or another method.

Figure 4:
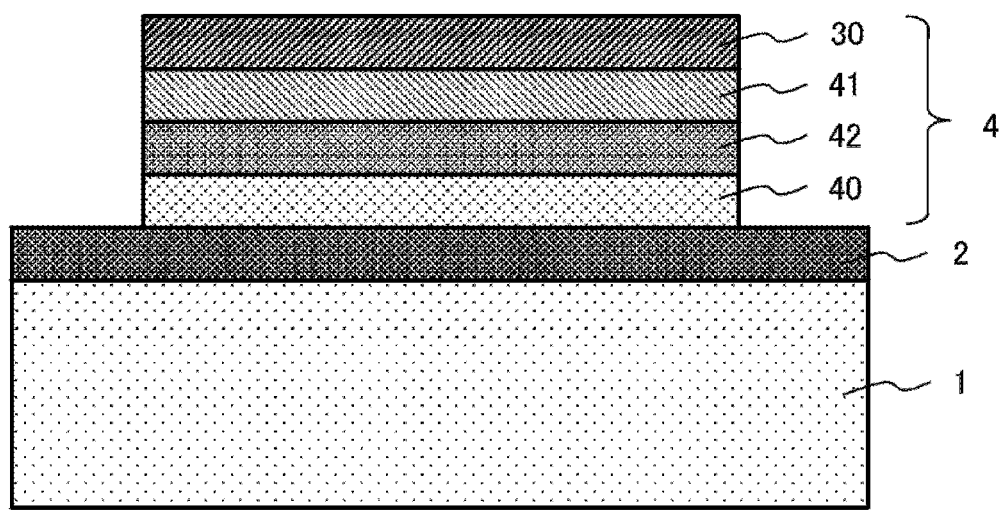
FIG. 4 is a sectional view for illustrating the method of manufacturing the semiconductor element structure according to Embodiment 1.

Subsequently, as shown in FIG. 4, on the front surface of the thus-stacked Au layer 41, the metal layer 30 as the lower layer for the MIM capacitor 3 is stacked, so that the source electrode is formed. The metal layer as the lower layer for the MIM capacitor 3 is deposited by a vapor deposition method or sputtering. The material of the metal layer 30 is not particularly limited. The Au layer 41 may also serve as the metal layer 30 as the case may be.

Figure 5:
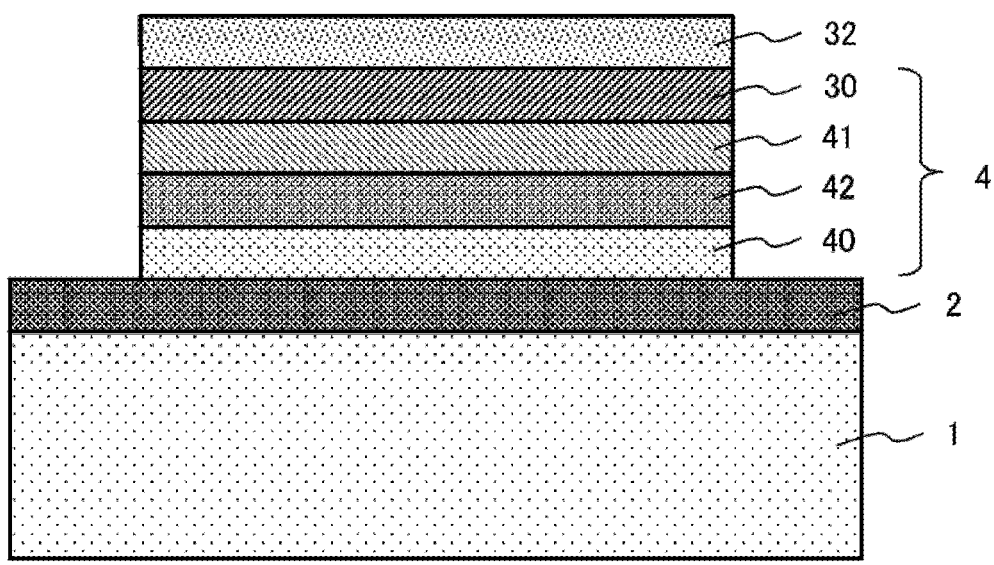
FIG. 5 is a sectional view for illustrating the method of manufacturing the semiconductor element structure according to Embodiment 1.
Figure 6:
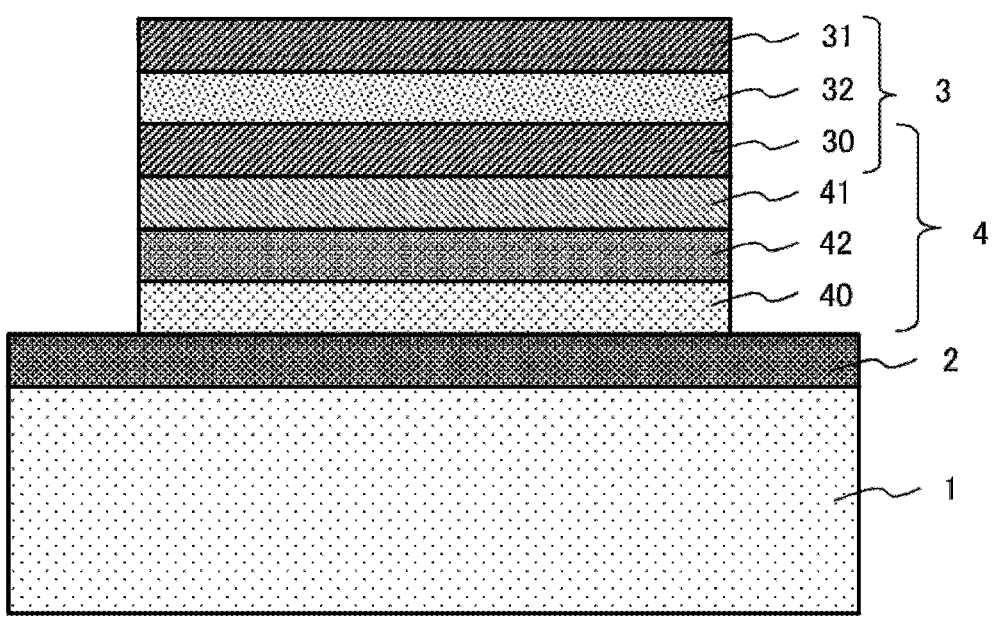
FIG. 6 is a sectional view for illustrating the method of manufacturing the semiconductor element structure according to Embodiment 1.

Then, as shown in FIG. 5, the insulating layer 32 is formed on the front surface of the thus-stacked metal layer 30 and, subsequently, as shown in FIG. 6, the metal layer 31 as the upper layer is stacked on the front surface of the thus-formed insulating layer 32, so that the MIM capacitor 3 is formed. The material of the metal layer 31 is not particularly limited. In most cases, Au is employed therefor.

Figure 7:
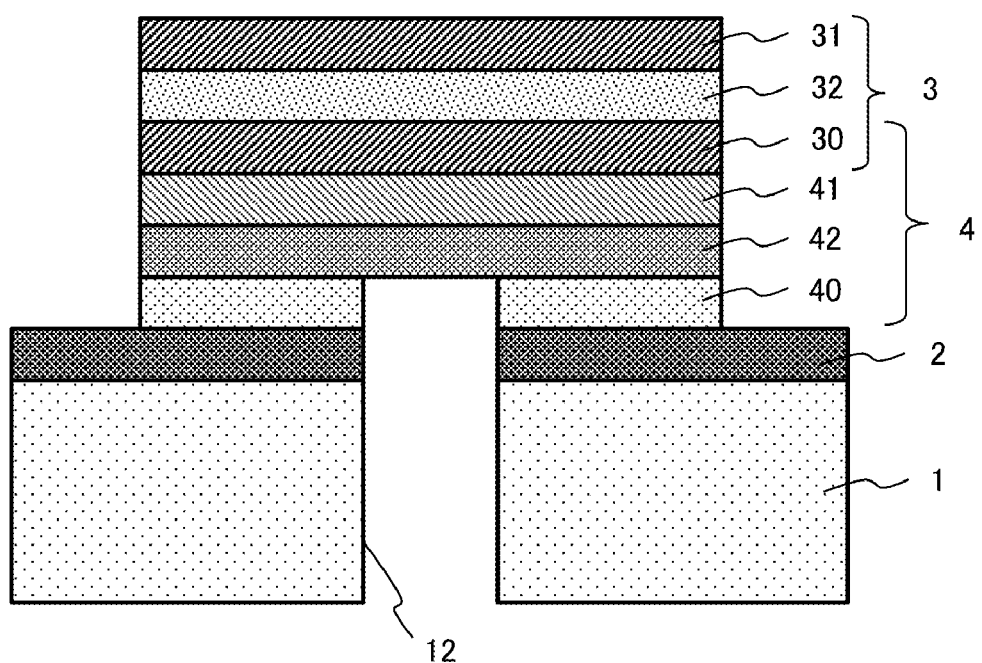
FIG. 7 is a sectional view for illustrating the method of manufacturing the semiconductor element structure according to Embodiment 1.

Subsequently, as shown in FIG. 7, a hole 12 for the via hole, that extends from the rear surface side of the SiC substrate 1 to reach the rear surface side of the source electrode 4, is created by dry etching using an $SF_6$—$O_2$ gas. At the time of creation of the hole 12, as an etching mask, a mask of Ni, Cr or the like is used. This is because Ni and Cr provide a very high etching-selectivity ratio under the etching condition of the SiC substrate 1 and the GaN layer 2 (the etching rate of Ni or Cr is about 20 times lower than the etching rate of them), and thus have resistance to dry etching. The depth end of the hole 12 only has to be placed between the rear surface of the Ti layer 40 and the rear surface of the barrier metal layer 42, so that the barrier metal layer 42 is not etched. The shape and size of the hole 12 are not particularly limited.

Figure 8:
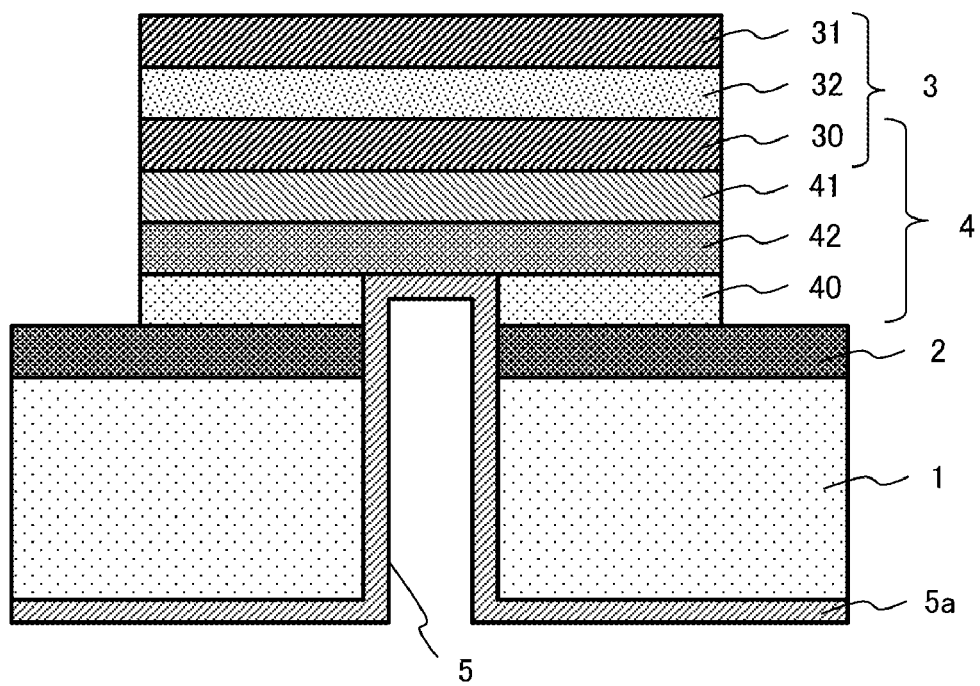
FIG. 8 is a sectional view for illustrating the method of manufacturing the semiconductor element structure according to Embodiment 1.

Lastly, as shown in FIG. 8, the via hole 5 and a rear surface electrode 5a are developed inside the hole 12 and over the rear surface of the SiC substrate 1 by sputtering or vapor deposition, in order to establish conduction from the source electrode 4 to the rear surface side. In view of coverage, sputtering is preferable. As the material for developing the via hole 5 and the rear surface electrode 5a, AuSn is generally used; however, AuGe or elemental Au may be used.

As described above, the semiconductor element structure 101 according to Embodiment 1 comprises: the SiC substrate 1 having the front surface on which the GaN layer 2 is stacked; the source electrode 4 formed on the front surface of the GaN layer 2; the MIM capacitor 3 formed on the front surface of the source electrode 4; and the via hole 5 extending from the rear surface of the SiC substrate 1 to reach the source electrode 4; wherein the barrier metal layer 42 is included in the source electrode 4; and wherein the bottom of the via hole 5 is placed between the rear surface of the source electrode 4 and the rear surface of the barrier metal layer 42. Namely, such a configuration is employed in which the barrier metal layer having resistance to a halogen element is inserted in the source electrode, so that it is possible to suppress intrusion of a halogen element, in particular, Br, into the insulating film that is placed in the MIM capacitor, over a long term, and accordingly, it is possible to suppress corrosion caused by intrusion of a halogen element into the insulating film or the metal member, and to suppress increase of the leakage current (degradation of the element reliability) due to deterioration in insulation property of the insulating film caused by that intrusion, over a long term. This makes it possible to provide a highly reliable element.

It is noted that in Embodiment 1, a case has been described where the barrier metal layer 42 in the source electrode 4 has a single-layer structure; however, this is not limitative. The layer may have a two-layer structure formed of a Cr layer and a V layer, or may be a layer made of a mixed crystal of Cr and V. If this is the case, in addition to achieving the above effect according to Embodiment 1, at the time of acid or alkali chemical treatment in the wafer processes after the formation of the via hole, it is possible: to cause the reaction, even if a chemical that is reactive with Cr or V is used, to be stopped at a border of either one of the layers in the stacked structure; or to execute such chemical treatment that is hardly applicable to a single barrier metal element, by controlling the chemical tolerance on the basis of the mixed crystal ratio. This makes it possible to increase flexibility of the process for the rear surface treatment. Note that, in the case of two-layer structure, the stacked order of the Cr layer and the V layer is not particularly limited.

Further, the barrier layer may have a three-layer structure formed of a Cr layer, a V layer and a Ni layer, or may be a layer made of a mixed crystal of Cr, V and Ni. If this is the case, it is possible not only to achieve an effect similar to that by the two-layer structure formed of the Cr layer and the V layer or by the layer made of a mixed crystal of Cr and V, but also to improve its resistance to dry etching at the time of creation of the via hole. This makes it possible to increase flexibility of the process for the rear surface treatment. Note that, in the case of three-layer structure, the stacked order of the Cr layer, the V layer and the Ni layer is not particularly limited.

Further, the barrier metal to be used for the barrier metal layer 42 is not limited to the above-described types. Any metal may be used therefor if it has a barrier property against a halogen. In addition, in the case where a MIM structure or another electrode/structure with a concern about deterioration by a halogen element, is formed beneath, for example, a drain electrode or the like, not beneath the source electrode, it is easily imaginable that protection can be made by the provision of a similar barrier metal.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

DESCRIPTION OF REFERENCE NUMERALS AND SIGNS

1: SiC substrate, 2: GaN layer, 3: MIM capacitor, 4: source electrode, 5: via hole, 42: barrier metal layer, 101: semiconductor element structure.

The invention claimed is:

1. A semiconductor element structure, comprising:
a SiC substrate having a front surface on which a GaN layer is stacked;
a source electrode formed on a front surface of the GaN layer, the source electrode comprising a barrier metal layer and a first layer that provides ohmic contact with the GaN layer;
a MIM capacitor formed on a front surface of the source electrode and comprising a plurality of layers; and
a via hole extending from a rear surface of the SiC substrate to reach the source electrode, wherein
a bottom of the via hole is placed between a rear surface of the source electrode and a rear surface of the barrier metal layer, and
the barrier metal layer is positioned directly between the first layer and each of the plurality of layers of the MIM capacitor.

2. The semiconductor element structure according to claim 1, wherein the barrier metal layer is made of Cr or V.

3. The semiconductor element structure according to claim 1, wherein the barrier metal layer is formed of two layers of a Cr layer and a V layer.

4. The semiconductor element structure according to claim 1, wherein the barrier metal layer is made of a mixed crystal of Cr and V.

5. The semiconductor element structure according to claim 1, wherein the barrier metal layer is formed of three layers of a Cr layer, a V layer and a Ni layer.

6. The semiconductor element structure according to claim 1, wherein the barrier metal layer is made of a mixed crystal of Cr, V and Ni.

7. The semiconductor element structure according to claim 1, wherein the MIM capacitor comprises a first metal layer formed on the front surface of the source electrode, a second metal layer, and an insulating film, the insulating film being sandwiched between the first metal layer and the second metal layer.

8. The semiconductor element structure according to claim 7, wherein
the first layer is a Ti layer,
the source electrode further comprises an Au layer, and
the Ti layer, the barrier metal layer, and the Au layer are sequentially stacked on the front surface of the GaN layer.

9. The semiconductor element structure according to claim 8, wherein the Au layer of the source electrode also serves as the first metal layer of the MIM capacitor.

10. The semiconductor element structure according to claim 1, wherein the barrier metal layer suppresses intrusion of a halogen into an insulating film of the MIM capacitor.

11. A semiconductor element structure, comprising:
a SiC substrate having a front surface on which a GaN layer is stacked;
a drain electrode formed on a front surface of the GaN layer, the drain electrode comprising a barrier metal layer and a first layer that provides ohmic contact with the GaN layer;
a MIM capacitor formed on a front surface of the drain electrode and comprising a plurality of layers; and
a via hole extending from a rear surface of the SiC substrate to reach the drain electrode, wherein
a bottom of the via hole is placed between a rear surface of the drain electrode and a rear surface of the barrier metal layer, and
the barrier metal layer is positioned directly between the first layer and each of the plurality of layers of the MIM capacitor.

12. The semiconductor element structure according to claim 11, wherein the barrier metal layer is made of Cr or V.

13. The semiconductor element structure according to claim 11, wherein the barrier metal layer is formed of two layers of a Cr layer and a V layer.

14. The semiconductor element structure according to claim 11, wherein the barrier metal layer is made of a mixed crystal of Cr and V.

15. The semiconductor element structure according to claim 11, wherein the barrier metal layer is formed of three layers of a Cr layer, a V layer and a Ni layer.

16. The semiconductor element structure according to claim 11, wherein the barrier metal layer is made of a mixed crystal of Cr, V and Ni.

17. The semiconductor element structure according to claim 11, wherein the MIM capacitor comprises a first metal layer formed on the front surface of the drain electrode, a second metal layer, and an insulating film, the insulating film being sandwiched between the first metal layer and the second metal layer.

18. The semiconductor element structure according to claim 17, wherein
   the first layer is a Ti layer,
   the drain electrode further comprises an Au layer, and
   the Ti layer, the barrier metal layer, and the Au layer are sequentially stacked on the front surface of the GaN layer.

19. The semiconductor element structure according to claim 18, wherein the Au layer of the drain electrode also serves as the first metal layer of the MIM capacitor.

20. The semiconductor element structure according to claim 11, wherein the barrier metal layer suppresses intrusion of a halogen into an insulating film of the MIM capacitor.

* * * * *